United States Patent [19]

Gall

[11] Patent Number: 5,237,304

[45] Date of Patent: Aug. 17, 1993

[54] MAGNETIC SWITCH WITH EMI SHIELD

[75] Inventor: Kenneth E. Gall, County of Stephenson, Ill.

[73] Assignee: Honeywell Inc., Minneapolis, Minn.

[21] Appl. No.: 896,720

[22] Filed: Jun. 10, 1992

[51] Int. Cl.$^5$ ............................................. H01C 1/06
[52] U.S. Cl. ..................................... 338/64; 338/12; 338/324; 338/172; 338/200
[58] Field of Search ............... 338/64, 32 H, 172, 189, 338/191, 200, 201, 12

[56] References Cited

U.S. PATENT DOCUMENTS

| | | | |
|---|---|---|---|
| 3,673,537 | 6/1972 | Greger | 338/12 |
| 4,125,821 | 11/1978 | Masuda | 338/32 R |
| 4,311,981 | 1/1982 | Luzynski . | |
| 4,369,376 | 1/1983 | Ertl et al. . | |
| 4,508,092 | 4/1985 | Kiess et al. . | |
| 4,644,315 | 2/1987 | Hodges | 338/12 X |
| 4,677,946 | 7/1987 | Tomagne . | |

*Primary Examiner*—Marvin M. Lateef
*Attorney, Agent, or Firm*—William D. Lanyi

[57] ABSTRACT

A magnetically sensitive switch is provided with an electromagnetic interference shield molded within the housing of the switch. In one embodiment, the magnetically sensitive switch is a vane switch for use in an automobile ignition system. The electromagnetic interference shield is formed by appropriately bending a flat sheet at a plurality of bend lines to form a box-like structure. The box like structure has five surfaces and one or more connection legs extending from one of the surfaces. One surface of the box-like structure also serves as a potting dam when a potting material is deposited into the cavity formed by the five surfaces during the process by which internal components are potted within the cavity of the EMI shield. The vane switch also includes a magnet encapsulated within its housing structure and spaced apart from the magnetically sensitive device within the EMI shield by a predetermined gap. The gap is shaped and sized to permit a portion of a rotatable member to pass therethrough between the magnet and the magnetically sensitive device to affect the magnetic field approximate the device.

14 Claims, 3 Drawing Sheets

MAGNETIC SWITCH WITH EMI SHIELD

BACKGROUND OF THE INVENTION

1. Field of the Invention

The present invention is generally related to a magnetic switch and, more specifically, to a vane switch apparatus for use in an automobile engine ignition system wherein the operative components of the switch are shielded from the deleterious effects of electromagnetic interference.

2. Description of the Prior Art

Many types of magnetic switches are known to those skilled in the art. In addition, skilled artisans are familiar with the application of magnetic switches in association with vane switch apparatus used in the ignition system of automobiles.

For example, U.S. Pat. No. 4,311,981 which issued to Luzynski on Jan. 19, 1982, discloses an electric switch that is magnetically activated and includes a Hall effect sensor with a permanent magnet fixed on one side of the sensor and magnetic shielding interposed between the sensor and the fixed magnet to direct magnetic flux away from the sensor. When an operating magnet is moved toward and away from the other side of the sensor, it cooperates with the fixed magnet to produce an increased magnetic field through the sensor to activate it.

U.S. Pat. No. 4,677,946, which issued to Tamagne on Jul. 7, 1987, describes an apparatus for positioning two sensor devices. The two Hall effect sensor devices are positioned in a predetermined angular position with respect to each other and with respect to a distributor of an automobile. A first Hall effect sensor is mounted in a primary carrier to form a first alignment means at a firing point of the first Hall effect sensor. A second Hall effect sensor is mounted in a secondary carrier to form a second alignment means in the secondary carrier at a firing point of the second Hall effect sensor. A third alignment device is formed in the primary carrier at the predetermined angle from the first alignment means and the secondary carrier is mounted to the primary carrier so that the second and third alignment means are aligned and the two Hall effect sensors are able to provide output signals displaced by the predetermined angular rotation.

U.S. Pat. No. 4,508,092, which issued to Kiess et al on Apr. 2, 1985, discloses a magnetic sensor for an automobile ignition system. A Hall effect sensor is spaced intermediate a pair of opposing permanent magnets for concurrently generating dual magnetic flux fields within respective airgap regions formed between each of the magnets and the device. Alternatively a magnet is placed between two Hall effect sensors to define the regions. A toothed disk rotatably connected to the crank shaft of the engine causes different teeth to shunt the magnetic fields in each of the regions in a predetermined sequence for generating pulses at the device output indicative of the firing order of the engine.

U.S. Pat. No. 4,369,376, which issued to Ertl et al on Jan. 18, 1983, discloses a magnetic gate which includes a magnet having two poles. One of the poles has generally flat surfaces. A magnetically permeable metal piece bridges the magnetic flux of the magnet from one to the other of the poles. A semiconductor chip is provided with an integrated circuit. The chip is piezoelectrically unsensitive and is applied to the permeable metal piece.

Although many different types of apparatus are known to the skilled artisan for applying magnetically sensitive devices, such as Hall effect sensors, to switches used in automobile distributor systems, certain problems still exist in the application of these devices. When the Hall effect device is subjected to electromagnetic interference, or EMI, there exists a likelihood that false electrical signals will be generated within the circuitry connected to the magnetically sensitive device. In an automobile engine application, these false signals can cause ignition devices, such as spark plugs, to be fired at the wrong time and in the incorrect sequence. The operation of the associated automobile engine will therefore be adversely effected. Certain automobile engine designs avoid this problem by placing the vane switch at an opportune location away from sources of EMI when the arrangement of engine components permits this technique to be used. Other designs utilize cup-shaped rotatable toothed members which are disposed between the magnetically sensitive device and sources of EMI. In this way, the cup-shaped rotatable member shields the magnetically sensitive device and its circuitry from the EMI because the cup-shaped device provides a path to a point of ground potential.

The sensitivity of a magnetically sensitive device to the adverse affects of electromagnetic interference is a function of its location within the engine compartment of an automobile and the relative position of EMI sources with respect to the device. This sensitivity and dependence on shielding by other components creates a disadvantage in the manufacture of automobile ignition systems. It would therefore be significantly advantageous if a magnetically sensitive switch could be provided which is not sensitive or dependent on the physical location of the switch within the engine compartment or the relative location of other devices for us in shielding the switch from the adverse affects of EMI.

SUMMARY OF THE INVENTION

The present invention provides a magnetically sensitive switch that is operable as a vane switch in an automotive ignition system. In a preferred embodiment of the present invention, the magnetically sensitive device within the switch structure is protected by an EMI shield that is permanently molded into the plastic housing of the vane switch. In a most preferred embodiment of the present invention, the EMI shield comprises a metallic box that is made of an electrically conductive, but non-magnetic, material. The box is disposed around the magnetically sensitive device and is connected to a point of ground potential relative to the electrical system of the automobile. In a particularly preferred embodiment of the present invention, one surface of the box is used as a potting dam during the manufacture of the apparatus when potting material is disposed around the magnetically sensitive device, which can be a Hall effect element, within the housing structure.

A preferred embodiment of the present invention provides a magnetically sensitive switch which comprises a magnetically sensitive component, such as a Hall effect sensor, and a permanent magnet that is spaced apart from the magnetically sensitive component in order to define a gap therebetween. A housing structure is also provided as part of the magnetically sensitive switch and the permanent magnet and magnetically sensitive component are disposed within the housing structure. An electromagnetic interference shield is shaped to receive the magnetically sensitive component therein and a means is provided for connecting the shield to a point of electrical ground potential. In one particular embodiment of the present invention, the shield comprises a metallic box that is made from a single sheet of material that is folded to form a five-sided structure. A portion of the metallic box is shaped to operate as the connecting means which permits the shield to be attached in electrical communication with the point of electrical ground potential.

BRIEF DESCRIPTION OF THE DRAWING

The present invention will be more fully understood from a reading of the Description of the Preferred Embodiment in conjunction with the drawing, in which.

DESCRIPTION OF THE PREFERRED EMBODIMENT

Figure 1:
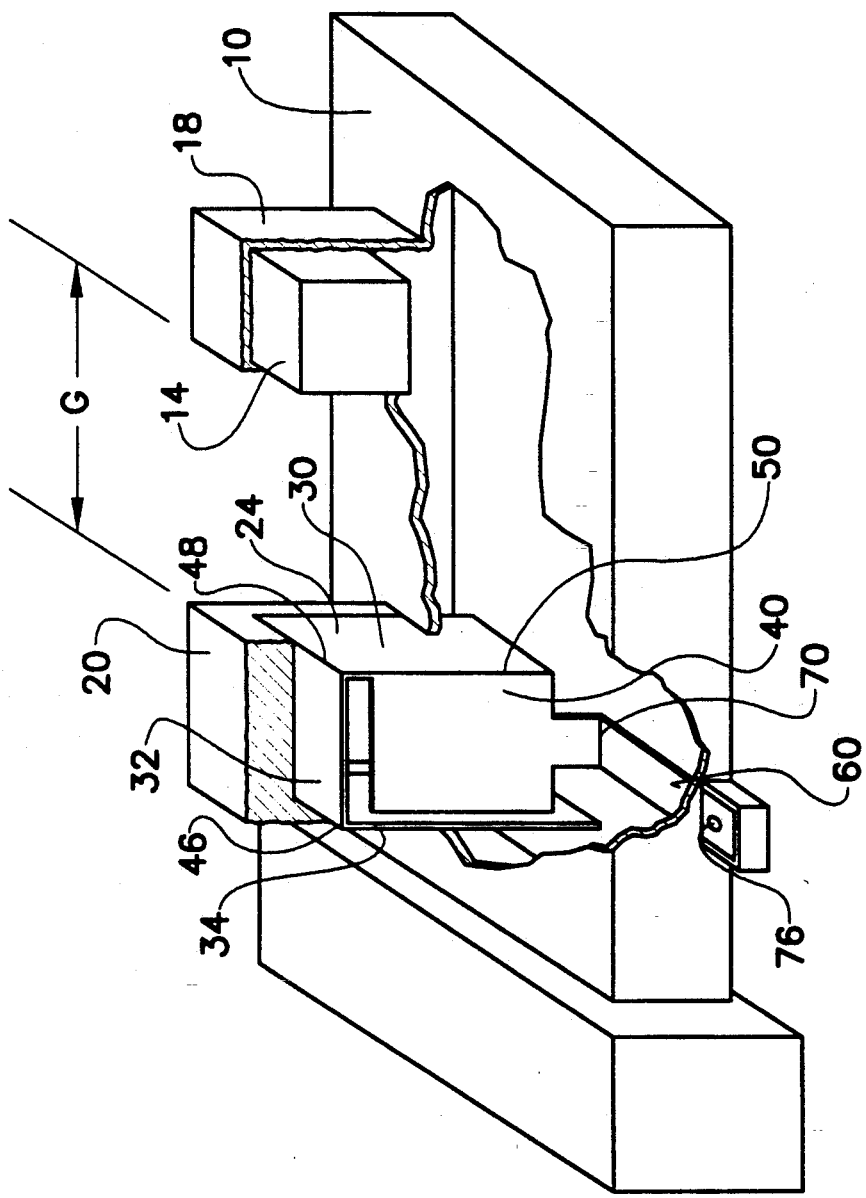
FIG. 1 illustrates a vane switch made in accordance with one embodiment of the present invention.

Throughout the Description of the Preferred Embodiment of the present invention, like components will be identified with like reference numerals.

FIG. 1 is an illustration of an automotive vane switch apparatus that is partially sectioned to facilitate the following description. The vane switch comprises a housing structure 10 which is shaped to contain and protect the operative components of the vane switch in their proper relative positions. A permanent magnet 14, which can be a rare earth magnet or an Alnico magnet, is disposed within a first portion 18 of the housing structure. A second portion 20 of the housing structure is spaced apart from the first portion 18 as illustrated in FIG. 1. Within the second portion 20, a Hall effect element or other suitable magnetically sensitive device is disposed. The magnetically sensitive device and the permanent magnet 14 are spaced apart to define a gap G therebetween. As will be discussed below, the gap G is shaped and sized so that a magnetically permeable device can pass therethrough to affect the magnetic field provided by the permanent magnet 14 proximate the magnetic sensitive device.

Figure 2:
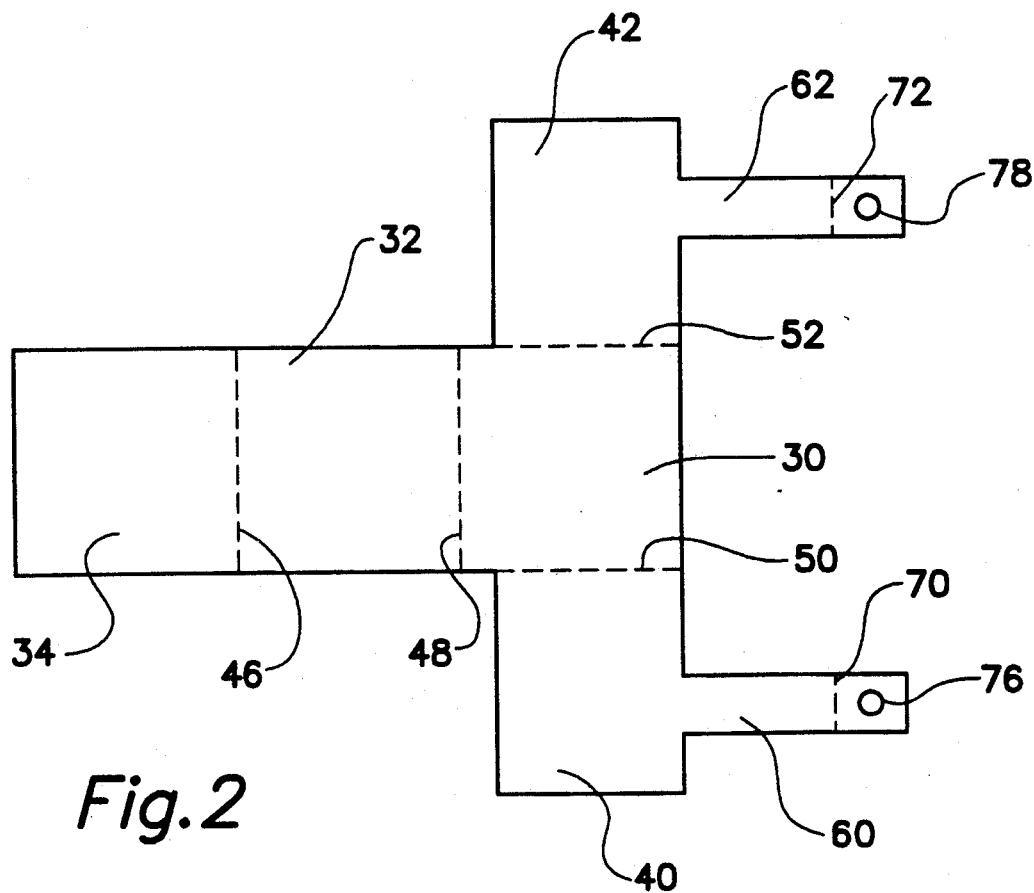
FIG. 2 shows a flat plate that is bendable into the configuration of an electromagnetic interference shield.

The embodiment of the present invention shown in FIG. 1 comprises an EMI shield 24 that, in turn, comprises a plurality of surfaces which are disposed around the magnetically sensitive device. The most preferred embodiment incorporates a shield which comprises five surfaces that result from the selective folding and shaping of a single flat piece of sheet material. The embodiment of the electromagnetic interference shield 24 shown in FIG. 1 is made by folding the sheet material illustrated in FIG. 2 at the locations indicated by dashed lines. A potting dam surface 30 is connected to a top surface 32 which, in turn, is connected to an end surface 34. Two side surfaces, 40 and 42, are also connected to the potting dam surface 30. The end surface 34 is connected to the top surface 32 at the dashed line 46 which is a bend line that will result in the perpendicular association between the end surface and the top surface. Similarly, the top surface 32 is attached to the potting dam surface 30 at dashed line 48 and, when the device shown in FIG. 2 is bent along that dashed line, the top surface and potting dam surface will be associated in a perpendicular relationship as shown. Both of the side surfaces, 40 and 42, are connected to the potting dam surface 30 at dashed lines 50 and 52, respectively. By bending the material at these dashed lines, the side surfaces can be associated with the potting dam surfaces in perpendicular relation.

By comparing FIGS. 1 and 2, it can be seen that the flat plate illustrated in FIG. 2 can be bent to provide a single piece box structure such as that identified by reference numeral 24 in FIG. 1. The connection legs, 60 and 62, extend from the side surfaces, 40 and 42, respectively to provide the means for connecting the EMI shield to a point of electrical ground potential. By providing bend lines, 70 and 72, the connection legs 60 and 62 can be shaped to have two segments perpendicularly related to each other. This facilitates the connection of the electromagnetic interference shield to the point of electrical ground and, in addition, the provision of two holes, 76 and 78, facilitates the attachment of the vane switch to another component in one particularly preferred embodiment which is shaped for a specific application.

With continued reference to FIG. 1, the housing structure 10 comprises a plastic material that is molded around the EMI shield 24. In addition, the housing structure 10 is shaped to provide a means to extend the connection legs from the housing structure. This is illustrated in FIG. 1 by the showing of hole 76 and its portion of connection leg 60 extending through the surface of the housing structure. This permits the vane switch apparatus shown in FIG. 1 to be attached to another device and, in addition, permits the EMI shield 24 to be electrically connected to a point of ground potential. Although not specifically illustrated in FIG. 1, it should be understood that a magnetically sensitive device, such as a Hall effect element, is disposed within the EMI shield 24.

The EMI shield 24 is molded directly into the housing structure 10 and is manufactured as a permanent component of the vane switch shown in FIG. 1. In one embodiment of the present invention, the plastic material of the housing structure 10 is disposed on all surfaces of the electromagnetic interference shield 24 except the potting dam surface 30. As shown in FIG. 1, the potting dam side 30 is exposed although all of the other external sides of the shield are encapsulated by the plastic walls of the housing structure 10. The purpose of the absence of plastic material proximate the potting dam side 30 is to minimize the distance between the Hall effect element and the permanent magnet. Although the gap G must be large enough to permit a moveable object to pass therethrough, it must be sufficiently small to provide the appropriate sensitivity of the magnetically sensitive device to the magnetic field provided by the permanent magnet. Therefore, the distance between the magnetically sensitive device and the permanent magnet 14 are minimized when a potting dam side 30 is provided.

Since the cavity within the second portion 20 is to be filled with a potting material to appropriately encapsulate the magnetically sensitive device within the second portion 20, some means must be provided to contain the potting material prior to its hardening. One possible alternative would be to provide a five-sided second portion 20 which would permit the potting material to be poured into its cavity from the under side of the vane switch. However, the existence of a required thickness of plastic material at the side of the second portion 20 most proximate the permanent magnet 14 would necessitate a thickness of material within the gap G which would increase the required magnitude of the gap G. As described above, any increased magnitude in gap G beyond that which is necessary to permit a moveable object to pass therethrough is disadvantageous because an increased gap diminishes the effectiveness of the magnetic field provided by the permanent magnet 14. To provide a potting dam while avoiding the need for the unnecessary thickness of the wall of the second portion 20, the present invention utilizes one surface of the box structure as a potting dam to avoid the need for having a five-sided second portion 20. The potting dam side 30 has been described above.

With continued reference to FIG. 1, it should be understood that during the manufacture of the vane switch made in accordance with the present invention, the EMI shield 24 is disposed in an appropriately configured mold and spaced apart from the first portion 18 by the correct distance that will result in a predetermined gap G. The plastic material of the housing structure 10 is molded around the EMI shield to result in the configuration shown in FIG. 1. Viewed from the underside of the perspective illustration in FIG. 1, the bottom opening of the EMI shield 24 permits the apparatus shown in FIG. 1 to be turned upside down and allows the magnetically sensitive device to be disposed within the EMI shield. After this component is properly placed within the EMI shield with the magnetically sensitive device proximate the potting dam surface 30, a potting material is caused to flow into the cavity of the EMI shield. This material hardens and protectively contains those components in their proper locations. The potting dam side 30 of the EMI shield prevents the potting material from flowing out of the open side of the second portion 20.

Figure 3:
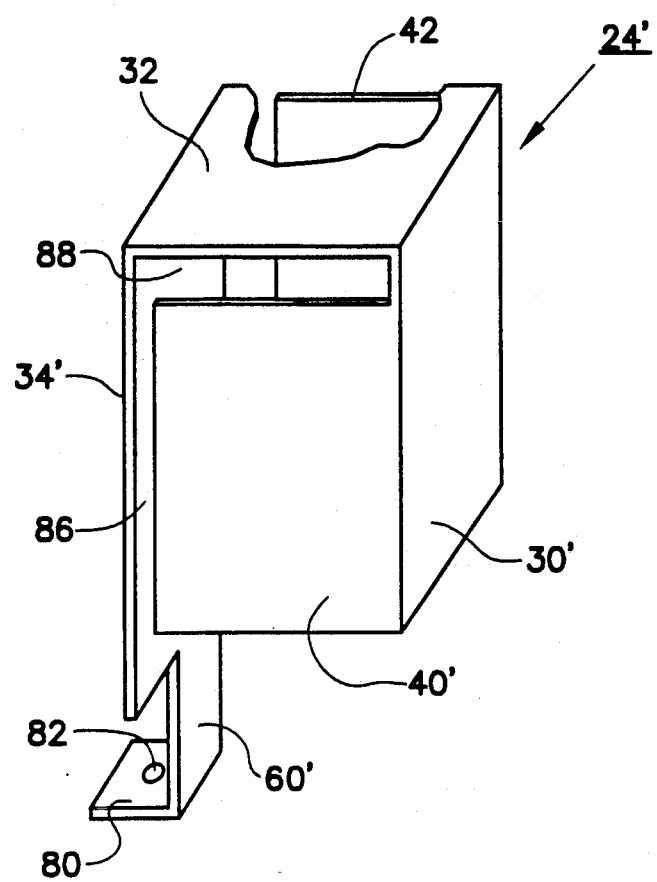
FIG. 3 shows an alternative configuration of an EMI shield made in accordance with the present invention.

An alternative configuration of the EMI shield 24 shown in FIG. 1 is illustrated in FIG. 3 and identified by reference numeral 24'. It is very similar to the EMI shield 24 shown in FIG. 1, but is shaped slightly differently to permit an alternative means for connecting the shield to a point of electrical ground. It should be understood that the differences between the embodiments shown in FIGS. 1 and 3 are not limiting to the scope of the present invention but, instead, merely illustrate two alternative configurations that are particularly adaptable to specific applications of the present invention. The embodiment shown in FIG. 3 is provided with a potting dam surface 30', a top surface 32', an end surface 34' and two side surfaces, 40' and 42'. A connection leg 60' extends downward from the end surface 34' rather than from the side surfaces as in the embodiment shown in FIG. 1. From the connection leg 60', a portion 80 extends perpendicularly to provide a means for connecting the EMI shield shown in FIG. 3 to a point of ground potential by utilization of the hole 82 in the portion 80 of the connection leg 60'.

With continued reference to FIG. 3, it can be seen that a space 86 exists between the end surface 34' and the most proximate edge of said surface 40'. Another space 88 typically exists between the top surface 32' and the upper edge of side surface 40'. Although not shown in FIG. 3, a similar space exists between the top surface 32' and the upper edge of other side surface 42'. These spaces provide ease of assembly during the bending operation by which the flat plates are formed into the box structures shown in FIGS. 1 and 3. These spaces are not absolutely required within the scope of the present invention. During the encapsulation procedure when the box like EMI shields are encased within the plastic material of the housing structure 10, a small amount of the plastic material may flow into the spaces identified by reference numerals 86 and 88. If this small seepage of plastic into the cavity of the EMI shield occurs, it can improve the structure of the vane switch by more firmly anchoring the EMI shield within the second portion 20 of the housing structure 10. However, if this seepage of plastic material down not occur during the encapsulation procedure, the EMI shield will still be sufficiently anchored within the housing structure.

Figure 4:
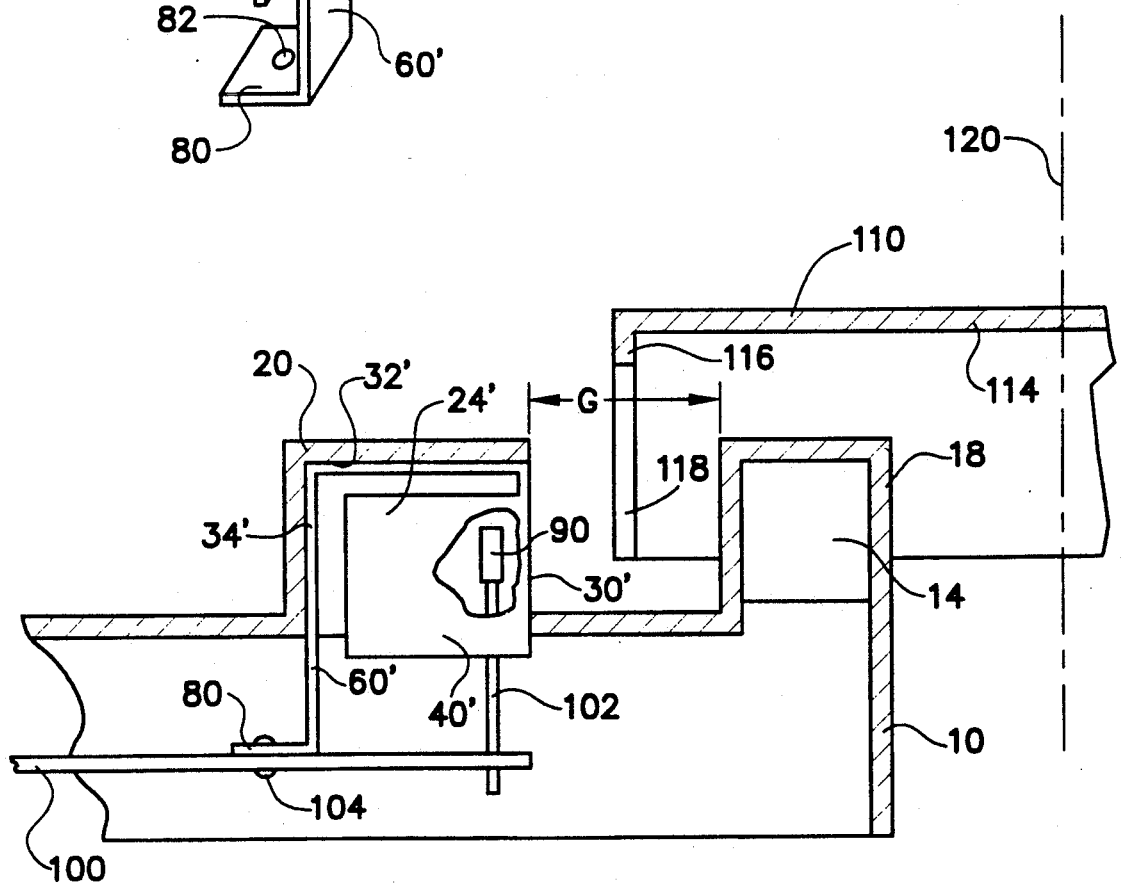
FIG. 4 is a section view of one embodiment of a vane switch made in accordance with the present invention.

FIG. 4 illustrates the EMI shield configuration shown in FIG. 3 disposed within a housing structure 10 that is illustrated in a sectioned side view. The housing structure 10 is shown in FIG. 4 with its first portion 18 that contains the permanent magnet 14. The second portion 20 of the housing structure is shown with the EMI shield 24' disposed therein. The potting dam surface 30', the end surface 34', the side surface 40' and the top surface 32' are also shown. A portion of the side surface 40' is removed to show the position of the magnetically sensitive device 90 within the internal cavity of the EMI shield. The connection leg 60' and its attached portion 80 are shown extending downward from the EMI shield toward a conductor 100 that is connected electrically to a negative terminal of the ignition system.

The magnetically sensitive device 90, which is a Hall effect sensor in a preferred embodiment of the present invention, is connected to the conductor 100 by a lead 102 and the portion 80 of the connection leg 60' is similarly connected to the conductor 100 by an attachment means 104. As described above, the vane switch shown in FIG. 4 would be temporarily turned upside down to dispose a preselected amount of potting material into the cavity of the EMI shield 24' through the bottom opening thereof.

FIG. 4 also illustrates the relative position of the permanent magnet 1 and magnetically sensitive device 90 and their respective association to an exemplary rotatable member 110 that is shown in section view. In certain embodiments of vane switches known to those skilled in the art, the rotatable member 110 comprises a cup-shaped structure with a generally flat portion 114 and raised sides 116 that comprise a plurality of teeth. For purposes of this illustration, an opening 118 between teeth is illustrated in the gap G. When an opening 118 of the rotatable member 110 is disposed between the permanent magnet 14 and the magnetically sensitive device 90, the magnetic field provided by the permanent magnet 14 is permitted to affect the magnetically sensitive device 90 without interference of any magnetically permeable material therebetween. However, when the opening 118 moves away from the space between the magnet and the magnetically sensitive device, a magnetically permeable tooth, or vane, moves into that space and has a magnetic effect on the lines of flux of the magnetic field in the gap and proximate the device 90. This effect can be sensed by the magnetically sensitive device 90. As the rotatable member 110 rotates about its axis of rotation 120, teeth and openings are sequentially passed through the gap G. This permits the apparatus shown in FIG. 4 to be used as a timing mechanism in the ignition system of an automobile.

Figure 5:
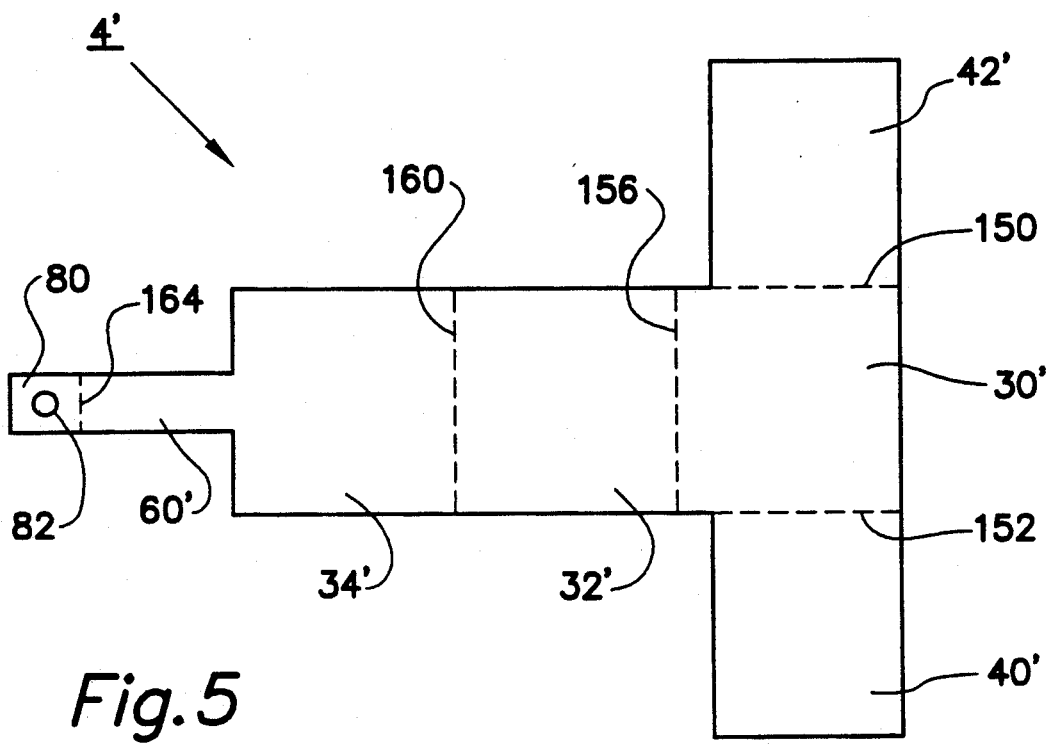
FIG. 5 is a flat plate that is bendable into the configuration shown in FIG. 3

FIG. 5 shows a flat plate which is bendable into the shape shown in FIG. 3. The side surfaces 40' and 42' are attached to the potting dam surface 30' at the locations indicated by bend lines 150 and 152. The top surface 32' is connected to the potting dam surface 30' at bend line 156 and the end surface 34' is attached to the top surface 32' at bend line 160. Extending from the end surface 34' is a connection tab 60' and portion 80 which is attached at bend line 164. Portion 80 has a hole 82 extending therethrough to permit the attachment of the shield to a point of electrical ground potential.

As can be realized in the above description, the present invention provides a vane switch that has reduced sensitivity to electromagnetic interference and other electrical noise problems when utilized in an environment in which those types of electrical and electromagnetic interferences exists. The present invention simplifies the shielding of the magnetically sensitive device by incorporating the EMI shield as an integral part of the housing. This avoids the need to very selectively place the vane switch in the automobile to avoid this type of interference. It also avoids the need for providing other means for externally shielding the magnetically sensitive device from electromagnetic interference. The present invention also provides the magnetically sensitive device to be placed relatively close to the permanent magnet because it provides a potting dam surface that eliminates the need for this function to be performed by a thicker portion of the housing structure. The present invention also provides a means for connecting the EMI shield to a point of ground potential.

Although the present invention has been described in detail and alternative embodiments have been illustrated with significant specificity, it should be understood that other embodiments of the present invention are within its scope.

The embodiments of the invention in which an exclusive property or right is claimed are defined as follows:

1. A magnetically sensitive switch, comprising:
a magnetically sensitive component,
a magnet spaced apart form said component to define a gap therebetween;
a housing structure, said component and said magnet being disposed within said housing structure;
an electromagnetic EMI shield shaped to receive said component therein and disposed within said housing structure; and
means for connecting said shield to a point of electrical ground, said connecting means being an integral portion of said shield.

2. The switch of claim 1, wherein:
said shield comprises an electrically conductive and non-magnetic metallic box shaped to surround said component on five sides.

3. The switch of claim 2, wherein:
said metallic box comprises a single sheet of material folded to form a five sided structure.

4. The switch of claim 4, wherein:
said magnetically sensitive component is a Hall effect device.

5. The switch of claim 4, wherein:
said switch is a vane switch.

6. A magnetically sensitive switch, comprising:
a housing structure;
a magnetically sensitive component disposed within said housing structure;
a magnet disposed within said housing structure, said magnet and said component being spaced apart to define a gap therebetween;
a rotatable member having a plurality of discontinuities formed therein, said rotatable member being associated with said switch to cause said plurality of discontinuities to pass through said gap in response to rotation of said rotatable member;
an EMI shield shaped to receive said component therein, said shield being encapsulated within said housing structure; and
means for connecting said shield to a circuit point of ground potential.

7. The switch of claim 6, wherein:
said component is a Hall effect device.

8. The switch of claim 7, wherein:
said shield is an electrically a conductive and non-magnetic metallic box.

9. The switch of claim 8, wherein:
said box is formed by folding a flat plate along a plurality of bend lines.

10. A magnetically sensitive switch, comprising:
a housing structure;
a magnet disposed within said housing structure;
a magnetically sensitive device disposed within said housing structure and spaced part form said magnet;
an electromagnetic shield disposed around said device and encapsulated within said housing structure, said shield comprising a potting dam surface; and
means for connecting said shield to a point of ground potential.

11. The switch of claim 10, wherein:
said device is a Hall effect element.

12. The switch of claim 10, wherein:
said switch is a vane switch of an ignition system.

13. The switch of claim 12, further comprising:
a rotatable member having a plurality of teeth disposed for movement between said magnet and said device.

14. The switch of claim 10, wherein:
said magnet is a permanent magnet.

* * * * *

UNITED STATES PATENT AND TRADEMARK OFFICE
CERTIFICATE OF CORRECTION

PATENT NO. : 5,237,304
DATED : August 17, 1993
INVENTOR(S) : Kenneth E. Gall

It is certified that error appears in the above-indentified patent and that said Letters Patent is hereby corrected as shown below:

```
Claim 8, line 2 (line 29 of column 8), after "electrically"
and before "conductive", delete "a".
```

Signed and Sealed this

Thirty-first Day of May, 1994

Attest:

BRUCE LEHMAN

*Attesting Officer*       Commissioner of Patents and Trademarks